United States Patent
Beroz et al.

(10) Patent No.: US 6,959,489 B2
(45) Date of Patent: Nov. 1, 2005

(54) METHODS OF MAKING MICROELECTRONIC PACKAGES

(75) Inventors: Masud Beroz, Livermore, CA (US); Michael Warner, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 462 days.

(21) Appl. No.: 09/956,448

(22) Filed: Sep. 19, 2001

(65) Prior Publication Data

US 2002/0105792 A1 Aug. 8, 2002

Related U.S. Application Data

(60) Provisional application No. 60/236,328, filed on Sep. 29, 2000.

(51) Int. Cl.$^7$ ................................................ H05K 3/34
(52) U.S. Cl. ............................ 29/840; 29/843; 29/842; 29/841; 29/832; 438/106; 438/118; 361/743; 228/180.21
(58) Field of Search ........................ 29/593, 855, 860, 29/743, 840–843, 832, 827, 829, 852; 438/106–108, 121, 427; 257/758, 774; 361/743, 764; 228/180.22

(56) References Cited

U.S. PATENT DOCUMENTS

| | | | |
|---|---|---|---|
| 5,148,265 A | 9/1992 | Khandros et al. ............... 357/80 |
| 5,148,266 A | 9/1992 | Khandros et al. ............... 357/80 |
| 5,455,390 A | 10/1995 | DiStefano et al. ........... 174/262 |
| 5,476,818 A | * 12/1995 | Yanof et al. .................... 29/832 |
| 5,518,964 A | 5/1996 | DiStefano et al. ........... 437/209 |
| 5,763,941 A | 6/1998 | Fjelstad ........................ 257/669 |
| 5,776,796 A | 7/1998 | DiStefano .................... 438/106 |
| 5,801,441 A | 9/1998 | DiStefano et al. ........... 257/696 |
| 5,830,782 A | 11/1998 | Smith et al. .................. 438/123 |
| 5,832,601 A | * 11/1998 | Eldridge et al. ............... 29/843 |
| 5,859,472 A | 1/1999 | DiStefano et al. ........... 257/674 |
| 5,904,498 A | 5/1999 | Fjelstad ........................ 438/106 |
| 6,049,972 A | 4/2000 | Link et al. ..................... 29/827 |
| 6,117,694 A | 9/2000 | Smith et al. ................... 438/14 |
| 6,191,368 B1 | 2/2001 | Di Stefano et al. .......... 174/260 |
| 6,214,640 B1 | 4/2001 | Fosberry et al. ............. 438/106 |
| 6,261,863 B1 | 7/2001 | Beroz et al. .................. 438/106 |
| 6,651,321 B2 | * 11/2003 | Beroz et al. ................... 29/840 |
| 2002/0105792 A1 | * 8/2002 | Beroz et al. ................. 361/811 |

* cited by examiner

Primary Examiner—Minh Trinh
(74) Attorney, Agent, or Firm—Lerner, David, Littenberg, Krumholz & Mentlik, LLP

(57) ABSTRACT

A method of making a microelectronic package includes providing a substrate having a plurality of conductive leads at a first surface of the substrate. The conductive leads may have first ends permanently attached to the substrate and second ends remote from the terminal ends, the second ends being movable relative to the first ends of the leads. One or more microelectronic elements having contact bearing surfaces and back surfaces remote therefrom may be juxtaposed with the substrate and the contacts connected with the first ends of the leads. A substantially rigid plate may be attached to the back surfaces of the microelectronic elements. The substantially rigid plate may be moved to a precise height above the substrate to vertically extend the leads. While the plate is maintained at the precise height above the substrate, a spacer material is dispensed between the plate and the substrate. The spacer material is then at least partially cured for holding the plate at the precise height above the substrate.

22 Claims, 5 Drawing Sheets

METHODS OF MAKING MICROELECTRONIC PACKAGES

CROSS-REFERENCE TO RELATED APPLICATIONS

The present application claims benefit of U.S. Provisional Application Ser. No. 60/236,328, filed Sep. 29, 2000, the disclosure of which is hereby incorporated by reference herein.

FIELD OF THE INVENTION

The present invention relates to microelectronic packages having leads and specifically relates to methods of making microelectronic packages having arrays of vertically extended leads.

BACKGROUND OF THE INVENTION

Complex microelectronic devices such as semiconductor chips typically require numerous connections to other electronic components. For example, a complex device including a semiconductor chip may require hundreds of electrical connections between the chip and one or more external devices. These electrical connections may be made using several alternative methods, including wire bonding, tape automated bonding and flip-chip bonding. Each of these techniques presents various problems including difficulty in testing the chip after bonding, long lead lengths, large areas occupied by the chip on a microelectronic assembly, and fatigue of the connections due to changes in size of the chip and the substrate during thermal expansion and contraction.

In many microelectronic devices, it is desirable to provide an electrical connection between components that can accommodate relative movement between the components. For example, where a semiconductor chip is mounted to a circuit board, thermal expansion and contraction of the chip and circuit board can cause the contacts on the chip to move relative to contacts on the circuit board. This movement can occur during operation of the device or during manufacturing operations (e.g. when soldering the chip to the circuit board).

One structure that has been used to successfully address the above-mentioned problems is commonly referred to as a connection component such as that disclosed in certain preferred embodiments of commonly assigned U.S. Pat. Nos. 5,148,265, 5,148,266 and 5,455,390, the disclosures of which are hereby incorporated by reference herein. Connection components typically include a dielectric sheet having terminals thereon and flexible leads that are used to electrically interconnect the terminals with contacts on a microelectronic element, such as a semiconductor chip or wafer. The flexible leads permit thermal expansion and contraction of the microelectronic element and connection component, while maintaining a reliable electrical connection therebetween. The terminals of the connection component may be used to test the assembly, and/or attach the assembly to another microelectronic element, such as a printed circuit board. A compliant layer may be disposed between the microelectronic element and the connection component. The compliant layer typically encapsulates the leads and facilitates connection of the terminals to the contacts of another microelectronic element by compensating for variations in component flatness and the height of the terminals.

In certain preferred embodiments of commonly assigned U.S. Pat. No. 5,518,964 ("the '964 patent"), the disclosure of which is hereby incorporated by reference herein, a compliant microelectronic package is made by first connecting flexible leads between microelectronic elements, such as a chip and a connection component, and then moving the elements away from one another through a predetermined displacement so as to bend the leads. The leads may have first ends permanently attached to the connection component and second ends releasably attached to the connection component. The connection component may be juxtaposed with a semiconductor chip having contacts so that the second ends of the leads may be bonded to the contacts on the chip. Following bonding, the connection component and chip are moved away from one another, thereby vertically extending the leads. During or after movement, a curable liquid material, such as a silicone elastomer, may be introduced between the elements. The curable material may be cured, such as by using heat, to form a compliant layer surrounding the leads. The resulting semiconductor chip package has terminals on the connection component which are electrically connected to the contacts on the chip, but which can move relative to the chip so as to compensate for thermal expansion and contraction of the elements. The semiconductor chip package may be mounted to a circuit board by solder-bonding the terminals to conductive pads on the circuit board. Relative movement between the chip and the circuit board during expansion and contraction of the components is facilitated by the moveable interconnection provided by the leads and the compliant layer.

In other embodiments of the '964 patent, the package-forming process may be conducted on a wafer scale, whereby that all of the semiconductor chips in a wafer may be connected to connection components in a single step. The resulting assembly is then severed to provide individual packages, each including one or more chips and a portion of a dielectric sheet. The above-described flexible leads may be formed on a semiconductor chip or wafer, rather than on the dielectric sheet. In further embodiments of the '964 patent, a dielectric body having terminals and leads is connected to terminal structures on a temporary sheet. The temporary sheet and dielectric body are moved away from one another so as to vertically extend the leads, and a curable liquid material is introduced around the leads and cured so as to form a compliant layer between the temporary sheet and the dielectric body. The temporary sheet is then removed, leaving the terminal structures projecting from a surface of the compliant layer.

In certain preferred embodiments of commonly assigned U.S. Pat. No. 6,117,694, the disclosure of which is hereby incorporated by reference herein, a microelectronic package is made by connecting leads between a pair of microelectronic elements and then moving the elements away from one another so as to bend the leads toward a vertically extensive disposition. After bending the leads, a curable encapsulant is injected between the microelectronic elements. The encapsulant may be injected under pressure for moving the microelectronic elements away from one another and for simultaneously bending the leads. Alternatively, the leads may be vertically extended by retaining the microelectronic elements against respective platens by vacuum, and then moving the platens away from one another for bending and forming the leads. A curable liquid encapsulant is preferably injected while the platens maintain the microelectronic elements in their displaced positions.

Despite these and other advances in the art, still further improvements would be desirable.

SUMMARY OF THE INVENTION

In accordance with certain preferred embodiments of the present invention, a method of making a microelectronic package includes providing a substrate having a plurality of conductive leads at a first surface thereof. The substrate may be a flexible dielectric sheet, a polymeric film, two metal tape, a ceramic substrate or a printed circuit board. The conductive leads preferably have first ends permanently attached to the substrate and second ends remote from the first ends, the second ends being movable relative to the first ends. The second ends of the leads may be releasably attached to the substrate. One or more microelectronic elements having contact bearing surfaces and back surfaces remote from the contact bearing surfaces are juxtaposed with the first surface of the substrate so that the contacts of the microelectronic elements face the leads of the substrate. The contacts of the microelectronic elements are then connected with the second ends of the leads. A substantially rigid plate may be attached to the back surfaces of the microelectronic elements. Attachment may occur using an adhesive, such as a thermally conductive adhesive.

After the substantially rigid plate has been attached to the back surface of the microelectronic elements, the joined plate and microelectronic elements and the substrate are moved away from one another in a controlled manner so as to vertically extend the leads between the substrate and the microelectronic elements. In certain preferred embodiments, the substantially rigid plate and the substrate are attached to opposing vacuum actuated platens that control movement of the plate and the substrate away from one another. In preferred embodiments, the substantially rigid plate is moved to a precise height above the first surface of the substrate. While the vacuum actuated platens maintain the substantially rigid plate at the precise height above the first surface of the substrate, a spacer material, such as a relatively fast curing material, is disposed between the plate and the substrate. The spacer material is then at least partially cured for maintaining the height of the plate relative to the substrate. As a result, the at least partially cured spacer material holds the substantially rigid plate at the precise height above the substrate. The spacer material may be selected from the group consisting of epoxies, silicones and acrylics. In particularly preferred embodiments, the spacer material is curable to a substantially rigid acrylic.

In certain preferred embodiments, the spacer material forms a dam that extends around the perimeter of the substantially rigid plate. The spacer material preferably has an inlet and an outlet so that a curable liquid material may be introduced through the inlet and into a gap extending between the substantially rigid plate and the substrate. The curable liquid material preferably includes epoxies, flexibilized epoxies, and silicones. In preferred embodiments, the curable liquid material is curable to form an elastomer. In one particularly preferred embodiment, the curable liquid material is curable to a silicone elastomer. The curable liquid encapsulant may be introduced under pressure or may enter the gap between the plate and substrate by capillary action. As the encapsulant is introduced through the inlet, the outlet of the spacer material allows air in the gap to escape through the outlet so as to minimize the creation of voids in the curable liquid material when such material is cured.

In one preferred embodiment, the substrate is secured by providing a lower platen having a plurality of apertures at a top surface thereof, positioning the substrate over the apertures of the lower platen, and drawing a vacuum through the apertures of the lower platen for holding the substrate in a stationary position atop the lower platen. During the moving step, a second platen may be abutted against the substantially rigid plate and a vacuum may be drawn through apertures in the second platen for holding the substantially rigid plate against the second platen. The first and second platens may be moved away from one another for vertically extending the leads. The substantially rigid plate is preferably made of a material selected from the group consisting of copper, nickel, alloys of copper and nickel, plastic or combinations thereof. Preferred microelectronic elements may include semiconductor wafers, semiconductor chips, packaged semiconductor wafers and packaged semiconductor chips.

In another preferred embodiment of the present invention, a method of making microelectronic packages includes providing a substrate having a plurality of conductive leads at a first surface thereof, the conductive leads having first ends permanently attached to the substrate and second ends movable relative to the first ends. A semiconductor wafer having contacts a the front contact-bearing surface thereof and the back surface remote therefrom may then be juxtaposed with the substrate so that the contact-bearing surface of the wafer confronts the first surface of the substrate. The contacts of the wafer may be connected to the second ends of the leads and the wafer and substrate moved away from one another so as to vertically extend the leads between the substrate and wafer. The wafer is preferably moved to a precise height above the substrate and, while maintaining the wafer at the precise height above the substrate, a spacer material, is provided between the wafer and the substrate. The spacer material is preferably dispensed between the wafer and the substrate in an uncured state. The spacer material is desirably at least partially cured for holding the wafer at the precise height above the substrate. The assembly may then be diced or severed to produce individual semiconductor packages having one or more semiconductor chips.

In still further preferred embodiments of the present invention, a microelectronic assembly includes a substrate having a first surface and one or more microelectronic elements positioned above the first surface of the substrate, each microelectronic element having a contact bearing face confronting the first surface of the substrate and a back surface remote therefrom. The assembly includes a substantially rigid plate attached to the back surfaces of the microelectronic elements. The microelectronic assembly also preferably includes an array of leads extending between the substrate and microelectronic elements, the leads having first ends attached to the substrate and second ends attached to the contacts of the microelectronic elements. A spacer material is desirably sandwiched between the substantially rigid plate and the substrate for holding the contact bearing faces of the microelectronic elements at a precise height above the substrate. The conductive leads are preferably flexible and are desirably made of aluminum, gold, copper, tin, and their alloys and/or combinations thereof.

These and other preferred embodiments of the present invention will be described in more detail below.

BRIEF DESCRIPTION OF THE DRAWINGS

FIGS. 4–7A show a method of making microelectronic elements having an array of leads, in accordance with one preferred embodiment of the present invention.

DETAILED DESCRIPTION OF PREFERRED EMBODIMENTS

Figure 1:
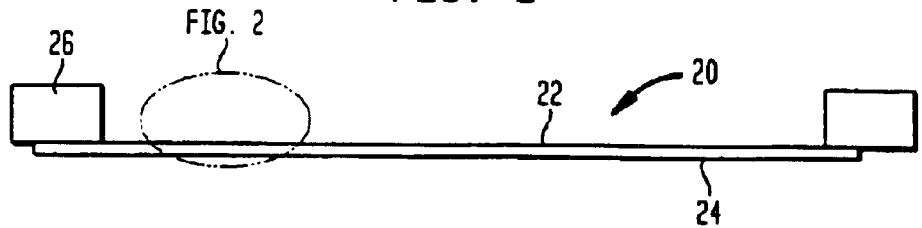
FIG. 1 shows a cross-sectional view of a flexible dielectric sheet mounted to a carrier frame, in accordance with certain preferred embodiments of the present invention.
Figure 2:
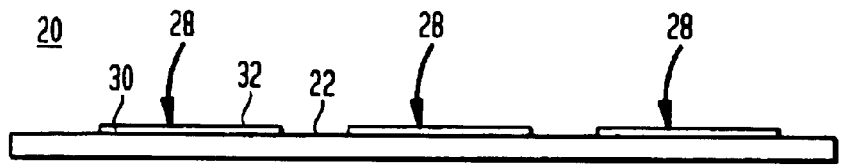
FIG. 2 shows an expanded view of a portion of FIG. 1 highlighted by the dashed circle.

Referring to FIG. 1, a flexible substrate 20, such as a flexible, dielectric film, includes a first surface 22 and a second surface 24 remote therefrom. The flexible substrate 20 is secured to a carrier frame 26, such as that disclosed in commonly assigned U.S. Pat. No. 6,049,972, the disclosure of which is hereby incorporated by reference herein. Referring to FIG. 2, the flexible substrate 20 includes a plurality of flexible conductive leads 28 formed on the first surface 22 of flexible substrate 20. The flexible conductive leads 28 may be made from a wide variety of conductive materials, including gold, aluminum, copper and their alloys. Each conductive lead 28 desirably includes a first end 30 that is permanently secured to the flexible substrate 20 and a second end 32 that is movable relative to first end 30 of lead 28. In certain preferred embodiments, the second ends 32 of the leads 28 are preferably releasably secured to and moveable away from the top surface 22 of flexible substrate 20. The leads provided atop substrate 20 may have many different shapes and/or designs, such as those disclosed in commonly assigned U.S. Pat. Nos. 5,518,964; 5,830,782; 5,859,472; and 6,191,368, the disclosures of which are hereby incorporated by reference herein.

Figure 3:
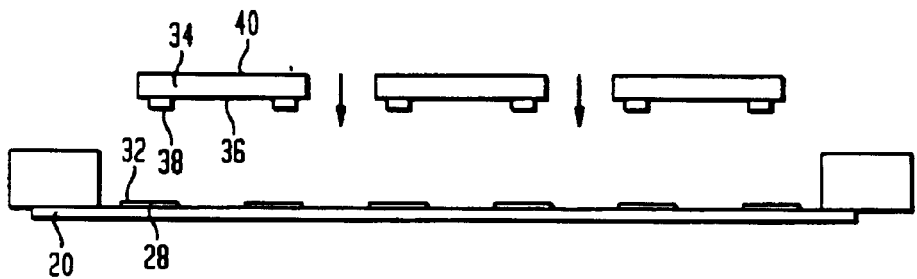
FIG. 3 shows a first step of an assembly method wherein microelectronic elements are assembled with the flexible dielectric substrate of FIG. 1.

Referring to FIG. 3, the flexible substrate 20 may be electrically interconnected with one or more microelectronic elements 34. In one particular preferred embodiment, the microelectronic elements 34 include a plurality of semiconductor chips, each chip having a front face 36 including contacts 38 and a back face 40 remote therefrom. During assembly, the chip contacts 38 are placed in substantial alignment with the second ends 32 of leads 28. A conductive paste (not shown) may be applied between the second ends 32 of leads 28 and contacts 38 in order to attach the second ends 32 of leads 28 to contacts 38.

In embodiments where the second ends 32 of leads 28 are releasable, adhesion between the flexible substrate 20 and the releasable portion of leads 28 may be reduced by using the methods disclosed in commonly assigned U.S. Pat. Nos. 5,763,941; 6,261,863; and 5,904,498 and U.S. patent application Ser. Nos. 09/020,750; 09/200,100; 09/290,975; 09/225,669; and 09/317,675, the disclosures of which are hereby incorporated by reference herein. For example, prior to forming the conductive leads 28 atop flexible substrate 20, an adhesion reducing substance, such as silicone, may be provided over the first surface 22 of dielectric substrate 20 for reducing the level of adhesion between the releasable portion of leads 28 and substrate 20. In the particular embodiment shown in FIGS. 1–3, the second ends 32 of leads 28 are commonly referred to as being releasable and the first ends 30 of leads 28 are commonly referred by as being fixed. In embodiments where the substrate 20 is made of a polymeric material, there may be no need to take affirmative steps to enhance the releasability of leads 28 because poor adhesion generally results between leads and polymeric layers when such leads are formed atop polymeric layers. In alternative embodiments, steps normally taken in the manufacture of the substrate to improve the adhesion between the substrate and the leads may be omitted.

Figure 4:
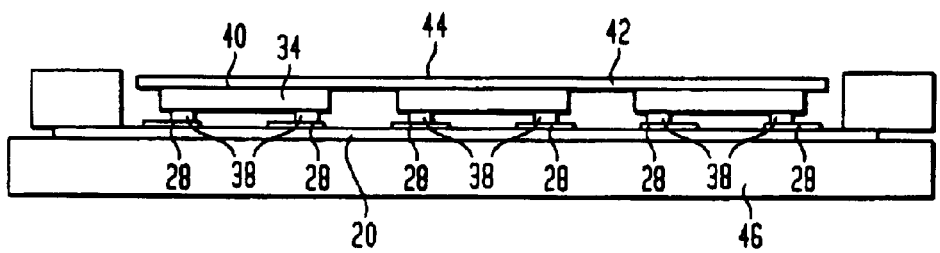

Referring to FIG. 4, after the microelectronic elements 34 have been attached to flexible substrate 20, a substantially rigid plate 42 is preferably attached to the back faces 40 of the semiconductor chips 34. A thermally conductive paste (not shown) may be used to adhere the plate 42 to the backside of the microelectronic elements 34. The substantially rigid plate 42 may be made of a wide variety of substantially rigid materials including copper, nickel, alloys of copper and nickel, plastics, and combinations of copper, nickel and plastics. The substantially rigid plate desirably has a plurality of openings extending therethrough. The openings may facilitate holding the microelectronic elements 34 against the plate 42 when drawing a vacuum on the top surface 44 of plate 42.

Figure 5:
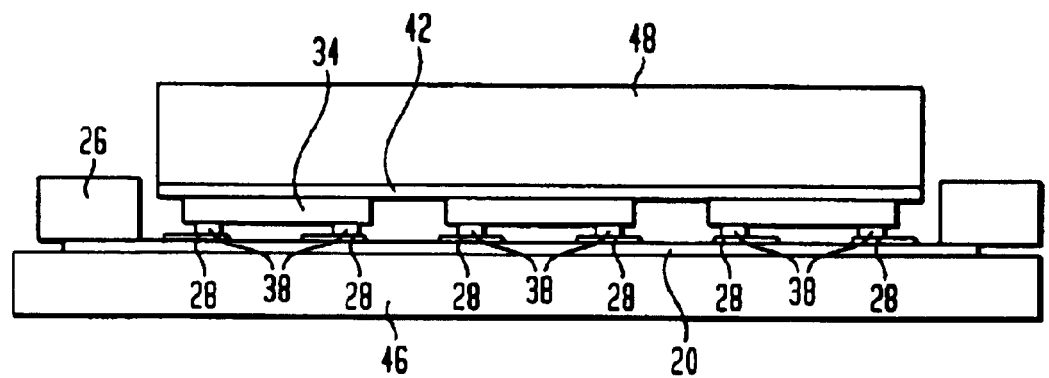

Referring to FIGS. 4 and 5, after leads 28 are attached to contacts 38, the substantially rigid plate 42 and the flexible substrate 20 may be moved away from one another through a controlled displacement using a lower platen 46 and an upper platen 48, as disclosed in commonly assigned U.S. Pat. No. 5,801,441, the disclosure of which is hereby incorporated by reference herein. A vacuum is preferably applied through upper platen 48 for firmly holding the substantially rigid plate 42 and through lower platen 46 for firmly holding flexible substrate 20 and carrier frame 26.

After the vacuum is drawn, the upper and lower platens 48, 46 are preferably moved away from one another. In certain preferred embodiments, lower and upper platens 46, 48 may also be moved in a horizontal direction relative to one another. The vertical movement is preferably about 100–500 microns and the horizontal movement is preferably about equal to the vertical movement. Horizontal movement of the elements may occur before, during or after vertical movement. In some embodiments, there may be no need to move the elements in the horizontal direction, particularly in embodiments having curved leads. During the controlled movement of upper and lower platens 48, 46, the second ends 32 of leads 28 are released from the top surface 22 of flexible substrate 20, while the fixed ends 30 remain fixed to flexible substrate 20. During movement, the leads 28 deform as the second ends 32 of leads 28 move in a vertical direction away from the first ends 30 of leads 28. The leads may have an S-shape after movement of the platens. The S-shape leads allows the leads to flex and bend during thermal cycling of a package so as to maintain reliable electrical interconnections between one or more microelectronic elements and the flexible substrate.

Figure 6:
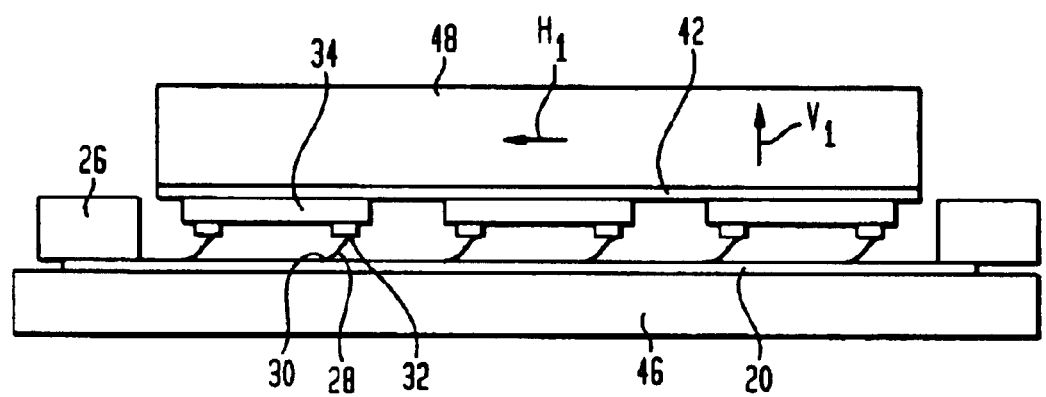

The net effect of the relative movement of the semiconductor chips 34 and flexible substrate 20 is to move the second ends 32 of leads 28 vertically away from and horizontally towards the first ends 30 of the same leads, thus forming each flexible lead 28 into a vertically extensive, curved structure, as illustrated in FIG. 6. Such a lead structure is able to flex and bend so as to compensate for movement of the semiconductor chips 34 and flexible substrate 20 relative to one another during thermal cycling. In embodiments where the leads are substantially straight, the second ends of the leads should move toward the first ends of the leads as the leads are vertically extended.

In other preferred embodiments, controlled movement of the semiconductor chip 34 and flexible substrate 20 may not include a horizontal component but only a vertical component. In these embodiments, the leads may be curved and the vertical movement preferably serves to partially straighten the leads 28. However, slack should be left in the leads 28 so as to allow for expansion and contraction of the elements relative to one another during thermal cycling.

Figure 7A:
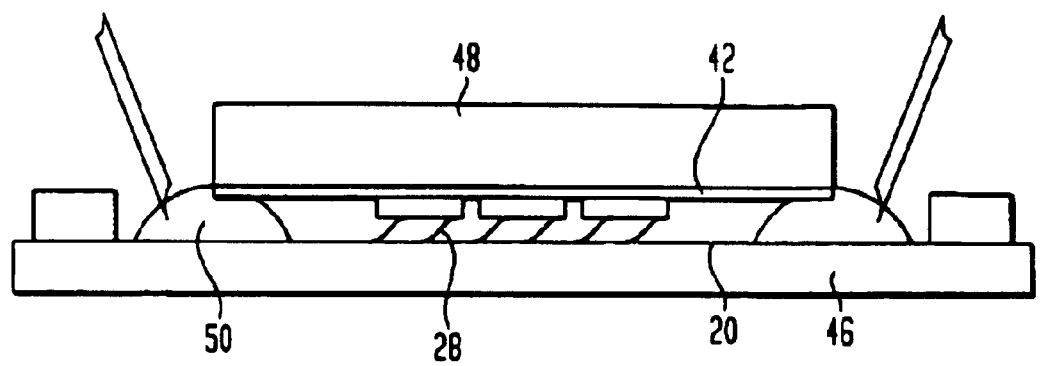
Figure 7B:
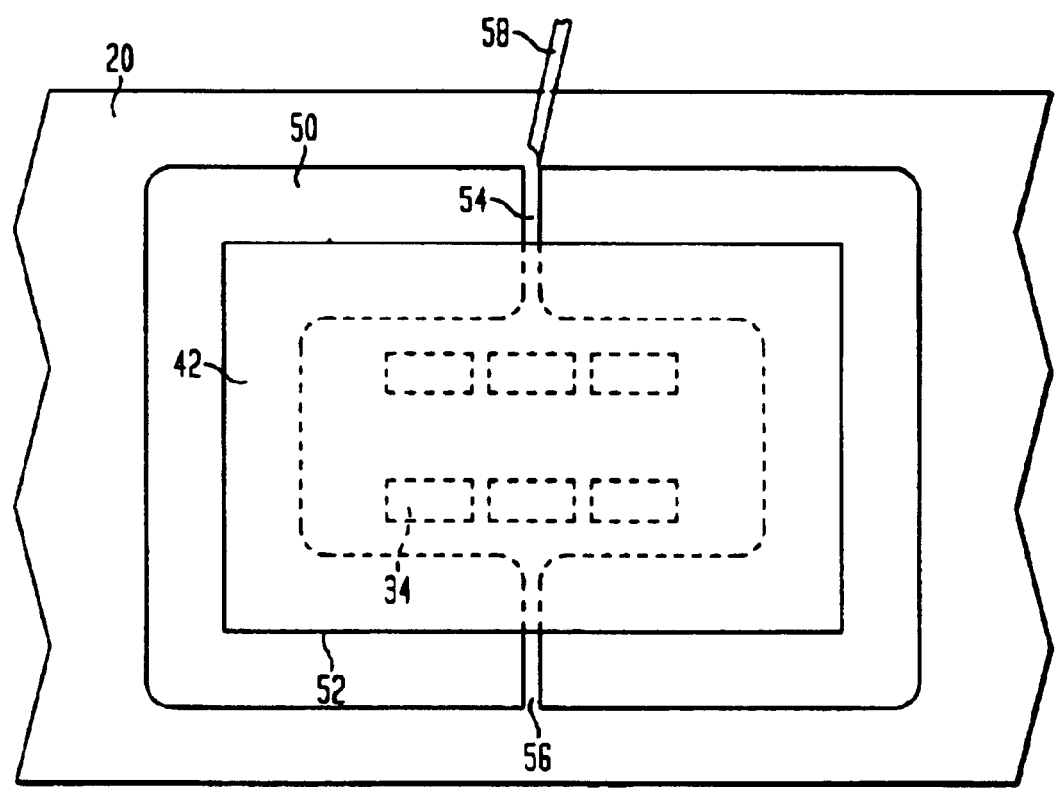
FIG. 7B shows a plan view of FIG. 7A.

Referring to FIGS. 7A and 7B, after substantially rigid plate 42 and flexible substrate 20 have been moved away from one another for vertically extending leads 28, a spacer material 50 is introduced between plate 42 and substrate 20. The spacer material is preferably curable. The spacer material 50 is introduced while upper and lower platens 48, 46 maintain rigid plate 42 at a precise height above flexible substrate 20. After spacer material 50 has been disposed between plate 42 and substrate 20, the upper and lower platens 48, 46 may be removed from engagement with rigid plate 42 and substrate 20, respectively. Although the present invention is not limited by any particular theory of operation, it is believed that providing spacer material 50 between plate 42 and substrate 20, while maintaining the plate at a precise height above the substrate, and then at least partially curing the spacer material 50, provides dimensional stability between plate 42 and substrate 20. As used herein, the terminology "dimensional stability" means that the spacer material, by itself and without the assistance of the vacuum platens, will maintain the plate and substrate away from one another by a desired distance that falls within an acceptable tolerance. Thus, once spacer material 50 has been put in place, upper and lower platens 48, 46 may be detached from engagement with rigid plate 42 and substrate 20, respectively, and the spacer material will retain plate 42 at the precise vertical height above substrate 20. As a result, the upper and lower platens may be detached from plate 42 and substrate 20 and used to manufacture another microelectronic package, thereby increasing the number of microelectronic packages that may be assembled in a given period of time. Preferred spacer materials include epoxy, silicone and acrylic. The spacer material is preferably a fast curing material and is preferable rigid after curing. One preferred spacer material is acrylic, such as UV curable acrylic. The spacer material 50 may be cured using heat, light, ultraviolet light or curing at room temperature. The spacer material 50 is desirably compatible with a curable liquid encapsulant injected between the microelectronic elements 34 and substrate 20 during a later assembly step, as will be described in more detail below.

Referring to FIG. 7B, in certain preferred embodiments, spacer material 50 preferably forms a dam that extends around the microelectronic elements 34 and the outer perimeter 52 of rigid plate 42. Certain preferred embodiments of commonly assigned U.S. Pat. No. 6,214,640, the disclosure of which is hereby incorporated by reference herein, teach using a ring as a dam. The dam includes an inlet 54 and an outlet 56. A dispenser 58 may be used to introduce a curable liquid encapsulant, such as a curable silicone material, into the inlet 54 of spacer material 50. As the curable liquid encapsulant is introduced into the inlet 54, any air between rigid plate 42 and substrate 20 is preferably discharged through outlet 56, thereby minimizing the formation of voids in the curable liquid encapsulant when the encapsulant is cured.

Figure 8:
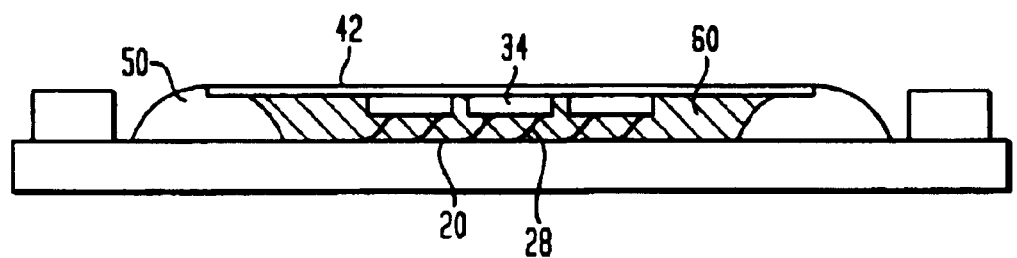
FIG. 8 shows the assembly of FIG. 7B during a further assembly step.

FIG. 8 shows a cross-sectional view of the subassembly shown in FIG. 7B, after the curable liquid encapsulant has been injected through inlet 54. The curable liquid encapsulant 60 extends between plate 42 and substrate 20, and surrounds the edge surfaces of semiconductor chips 34 and flexible leads 28 extending between chips 34 and substrate 20. The curable liquid encapsulant 60 is then cured to provide a compliant layer between chips 34 and substrate 20 that facilitates movement of the chips and substrate 20 relative to one another, while maintaining an electrical interconnection therebetween via flexible conductive leads 28.

Preferred methods for introducing a curable liquid encapsulant between microelectronic elements are disclosed in certain preferred embodiments of U.S. Pat. No. 5,801,441, the disclosure of which is hereby incorporated by reference herein. In preferred embodiments of the present invention, the encapsulant has a low viscosity and is introduced in an uncured state. The encapsulant preferably wets to the substrate and semiconductor chips, and effectively fills a gap therebetween. The encapsulant may be rigid or compliant. The encapsulant is desirably selected so that it forms a compliant layer upon being cured. Preferred encapsulants include silicone, epoxies and flexiblized epoxies. Other preferred encapsulants include elastomers, with silicone elastomers being particularly preferred. In some preferred embodiments, the encapsulant around the leads is rigid and the remainder of the encapsulant between the semiconductor chips and substrate is compliant. In other preferred embodiments, the encapsulant around the leads is compliant and the remainder of the encapsulant between semiconductor chips and substrate is rigid. In other embodiments, the package may include compliant pads made of silicone and the encapsulant may be an epoxy, as disclosed in the above-mentioned U.S. Pat. No. 6,261,863, the disclosure of which is hereby incorporated by reference herein.

In its liquid state, the encapsulant may be injected under pressure. The encapsulant may also be injected without external pressure and allowed to fill the gap between the semiconductor chips and substrate by capillary action. After being disposed between the semiconductor chips and substrate and around the leads, the encapsulant is preferably cured in place. Depending upon the formulation of the encapsulant, such curing may take place spontaneously at room temperature or may require exposure to energy, such as heat or radiant energy.

Figure 9:
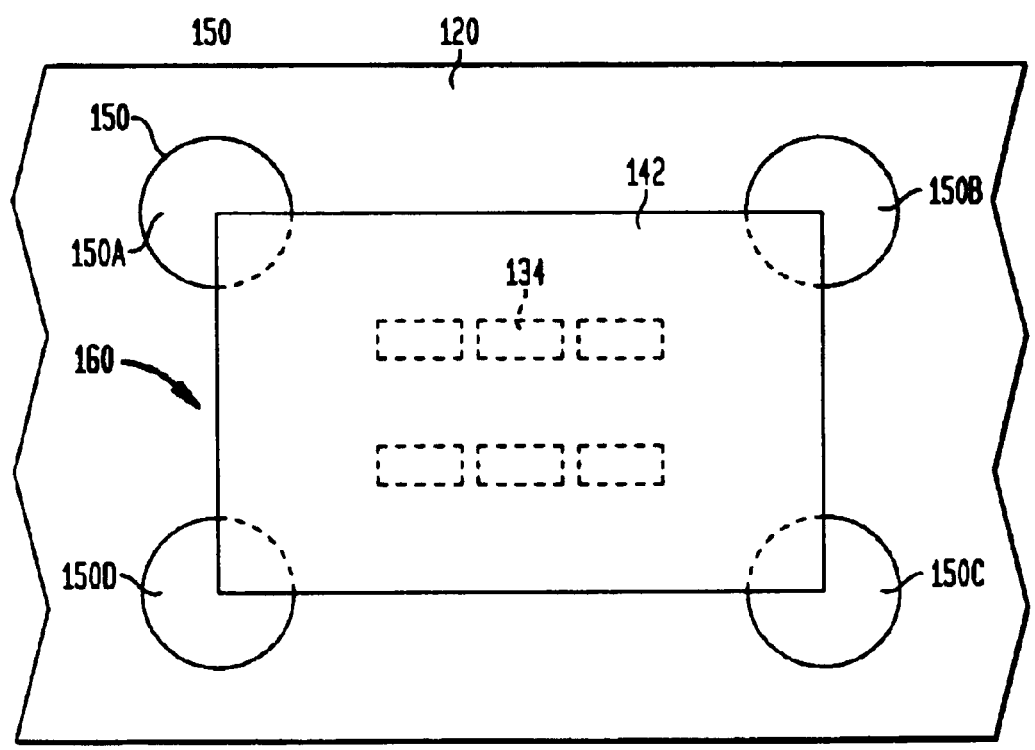
FIG. 9 shows a plan view of a microelectronic subassembly, in accordance with certain preferred embodiments of the present invention.

Referring to FIG. 9, in other preferred embodiments of the present invention, beads of spacer material 150A–150D are provided at the corners of plate 142. After semiconductor chips 134 have been electrically interconnected to substrate 120 via conductive leads (not shown), plate 142 is attached to the back surfaces of chips 134, and plate 142 and substrate 120 are moved away from one another using vacuum platens, as described above. The beads of spacer material 150A–150D are then disposed between the four corners plate 142 and flexible substrate 120, and at least partially cured to maintain a precise height or vertical distance between plate 142 and substrate 120. After the beads of spacer material 150A–150D have been at least partially cured to maintain dimensional stability, the platens may be removed from engagement with rigid plate 142 and substrate 120, respectively.

Figure 10:
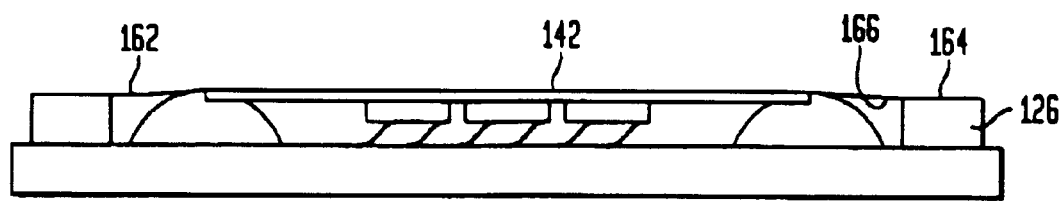
FIG. 10 shows a cross-sectional view of the subassembly of FIG. 9 having a coverlay applied atop the assembly, in accordance with certain preferred embodiments of the present invention.

Referring to FIGS. 9 and 10, because substantial gaps 160 exist between adjacent beads of spacer material (e.g. between beads 150A–150B), a coverlay 162 is preferably placed atop plate 142 and extended over a top surface 164 of substrate carrier 126. In certain preferred embodiments, adhesive (not shown) is applied to an underside 166 of coverlay 162 for maintaining coverlay 162 in place.

Figure 11:
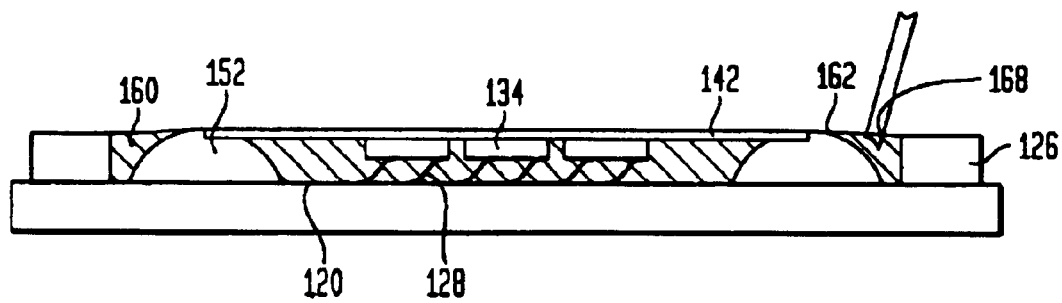
FIG. 11 shows the subassembly of FIG. 10 during a further assembly step.

Referring to FIG. 11, after coverlay 162 has been secured atop plate 142 and substrate carrier 126, a curable liquid encapsulant 160 may be injected through an opening 168 in coverlay 162. The curable liquid encapsulant 160 preferably flows between plate 142 and substrate 120 and around chips 134 and the beads of spacer material 150a–150D. In this particular embodiment, substrate carrier 126 and coverlay 162 dam the flow of curable liquid encapsulant 160. After the curable liquid encapsulant 160 has been introduced, the encapsulant is cured by using heat or energy to provide a compliant layer between chips 134 and substrate 120 and around flexible leads 128. In other preferred embodiments, a backside encapsulation process may be used as disclosed in certain preferred embodiments of commonly assigned U.S. Pat. No. 5,776,796, the disclosure of which is hereby incorporated by reference herein.

Figure 12:
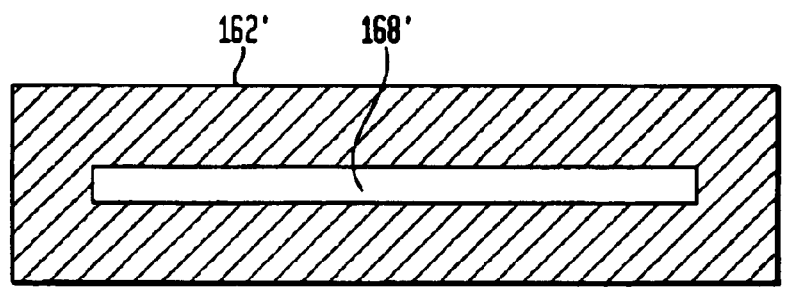
FIG. 12 shows a plan view of a coverlay, in accordance with further preferred embodiments of the present invention.

Referring to FIG. 12, in certain preferred embodiments, the coverlay 162' may have a central opening 168'. After coverlay 162' has been placed over a top surface of a substantially rigid plate, such as plate 142 shown in FIG. 11, a vacuum platen may draw vacuum through the opening 168' to create adhesion between the substantially rigid plate and coverlay without requiring the use of an adhesive material.

In still other preferred embodiments of the present invention, the plurality of semiconductor chips 134 shown in FIGS. 2–11 may be replaced with a single semiconductor wafer. In these embodiments, a platen capable of drawing vacuum may be placed directly against the back face of the semiconductor wafer. As a result, there may be no need for a substantially rigid plate (as described above) for making semiconductor packages having an array of compliant leads. After the microelectronic assembly has been manufactured using the steps described above, the assembly may be severed to provide microelectronic packages including one or more semiconductor chips electrically interconnected with a portion of a flexible substrate by flexible leads.

In certain preferred embodiments, the second ends of each lead may be connected through a frangible element to the first end of an adjacent lead. The frangible elements may be formed as a continuation of a strip constituting the lead itself, with V-shaped notches extending toward a center of the strip from opposite sides thereof. During the assembly process, the second ends are bonded to the contacts of a chip or other microelectronic element in the same manner as described above. After bonding, the microelectronic element and flexible substrate are moved relative to one another in the same manner as discussed above, so that the second end of each lead moves vertically away from the first end of the lead. The second ends may also move in a horizontal direction toward the first ends. This action breaks the frangible element, and hence, releases each second end from its connection to the first end of the next adjacent lead. Such leads are disclosed in certain preferred embodiments of the '964 patent. In still other embodiments, the second ends of the leads may only be moved in a vertical direction relative to the first ends.

Although the present invention has been described with reference to particular preferred embodiments, it is to be understood that the embodiments are merely illustrative of principles and applications of the present invention. It is therefore to be understood that numerous modifications may be made to the preferred embodiments and that other arrangements may be devised without departing from the spirit and scope of the present invention as defined by the claims.

What is claimed is:

1. A method of making a microelectronic package comprising steps of:
   providing a substrate having a plurality of conductive leads at a first surface thereof, said conductive leads having first ends permanently attached to said substrate and second ends remote from the first ends, the second ends of said leads being movable relative to the first ends of said leads;
   providing one or more microelectronic elements having contact bearing surfaces and back surfaces remote therefrom and juxtaposing the contact bearing surfaces of said microelectronic elements with the first surface of said substrate;
   connecting the contacts of said microelectronic elements with the releasable ends of said leads;
   attaching a substantially rigid plate to the back surfaces of said microelectronic elements;
   moving said substantially rigid plate and said microelectronic elements attached thereto away from said substrate so as to vertically extend said leads between said substrate and said microelectronic elements, wherein said substantially rigid plate is moved to a precise height above said substrate; and
   while maintaining said substantially rigid plate at the precise height above said substrate, dispensing a spacer material between said plate and said substrate and at least partially curing said spacer material, wherein said at least partially cured spacer material holds said substantially rigid plate at the precise height above said substrate.

2. The method as claimed in claim 1, wherein the first ends of said conductive leads are releasably attached to said substrate.

3. The method as claimed in claim 1, further comprising securing said substrate atop a platen before the moving step.

4. The method as claimed in claim 3, wherein the securing said substrate step includes providing a lower platen having a plurality of apertures at a top surface thereof, positioning said substrate over the apertures of said lower platen, and drawing a vacuum through the apertures of said lower platen to hold said substrate in a stationary position atop said lower platen.

5. The method as claimed in claim 4, wherein the providing a substrate step includes attaching said substrate to a carrier frame.

6. The method as claimed in claim 5, further comprising securing a coverlay over said substantially rigid plate and said carrier frame.

7. The method as claimed in claim 6, wherein said coverlay is adhered to said substantially rigid plate and said carrier frame.

8. The method as claimed in claim 4, wherein the moving said substantially rigid plate step includes:
   abutting a second platen against said substantially rigid plate;
   drawing a vacuum through apertures in said second platen for holding said substantially rigid plate against said second platen; and
   moving said second platen away from said substrate and said first platen to vertically extending said leads.

9. The method as claimed in claim 1, further comprising depositing a curable liquid encapsulant between said substantially rigid plate and said substrate.

10. The method as claimed in claim 9, further comprising curing said curable liquid encapsulant to provide a compliant layer between said substantially rigid plate and said substrate.

11. The method as claimed in claim 10, wherein said curable liquid encapsulant is curable to a material selected from the group consisting of epoxies, flexibilized epoxies, and silicones.

12. The method as claimed in claim 11, wherein said curable liquid encapsulant is curable to a silicone elastomer.

13. The method as claimed in claim 1, wherein said spacer material is curable to a substantially rigid material.

14. The method as claimed in claim 1, wherein said spacer material is selected from the group consisting of epoxies and acrylics.

15. The method as claimed in claim 1, wherein the releasable ends of said leads are releasably secured to the first surface of said substrate before the moving step.

16. The method as claimed in claim 1, wherein the releasable ends of said leads are peelably secured to the first surface of said substrate before the moving step.

17. The method as claimed in claim 1, wherein said substantially rigid plate is made of a material selected from the group consisting of copper, nickel, their alloys, plastic and combinations thereof.

18. The method as claimed in claim 1, wherein said substantially rigid plate is thermally conductive.

19. The method as claimed in claim 1, wherein the attaching a substantially rigid plate includes adhering said substantially rigid plate to said one or more microelectronic elements using an adhesive.

20. The method as claimed in claim 19, wherein said adhesive is thermally conductive.

21. The method as claimed in claim 1, wherein said one or more microelectronic elements are selected from the group consisting of semiconductor wafers, semiconductor chips, packaged semiconductor wafers and packaged semiconductor chips.

22. The method as claimed in claim 1, wherein said substrate comprises a flexible dielectric sheet, a FR4 board, a FR5 board, or a ceramic plate.

* * * * *